(12) United States Patent
Yang et al.

(10) Patent No.: US 9,299,621 B2
(45) Date of Patent: Mar. 29, 2016

(54) SMART MEASUREMENT TECHNIQUES TO ENHANCE INLINE PROCESS CONTROL STABILITY

(71) Applicant: Taiwan Semiconductor Manufacturing Co., Ltd., Hsin-Chu (TW)

(72) Inventors: Han-Wei Yang, Hsinchu (TW); Yi-Ruei Lin, Taipei (TW); Chen-Chung Lai, Guanxi Township (TW); Kang-Min Kuo, Zhubei (TW); Bor-Zen Tien, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/024,688

(22) Filed: Sep. 12, 2013

(65) Prior Publication Data

US 2015/0069395 A1    Mar. 12, 2015

(51) Int. Cl.
*H01L 23/544* (2006.01)
*H01L 21/66* (2006.01)
*H01L 27/088* (2006.01)

(52) U.S. Cl.
CPC ............. *H01L 22/14* (2013.01); *H01L 22/12* (2013.01); *H01L 22/30* (2013.01); *H01L 22/34* (2013.01); *H01L 27/088* (2013.01)

(58) Field of Classification Search
CPC .......... H01L 21/265; H01L 21/76286; H01L 21/823814; H01L 22/12; H01L 22/14; H01L 27/0629; H01L 27/1463; H01L 29/6659; H01L 29/7833
USPC ................................ 257/48, 751; 438/16, 514
See application file for complete search history.

(56) References Cited

U.S. PATENT DOCUMENTS

2005/0156234 A1* 7/2005 Gammel et al. ............... 257/335
2012/0139051 A1* 6/2012 Ranade et al. ................ 257/368

* cited by examiner

*Primary Examiner* — David Vu
*Assistant Examiner* — Jonathan Han
(74) *Attorney, Agent, or Firm* — Eshweiler & Associates, LLC

(57) ABSTRACT

An integrated circuit includes a number of lateral diffusion measurement structures arranged on a silicon substrate. A lateral diffusion measurement structure includes a p-type region and an n-type region which cooperatively span a predetermined initial distance between opposing outer edges of the lateral diffusion measurement structure. The p-type and n-type regions meet at a p-n junction expected to be positioned at a target junction location after dopant diffusion has occurred.

20 Claims, 9 Drawing Sheets

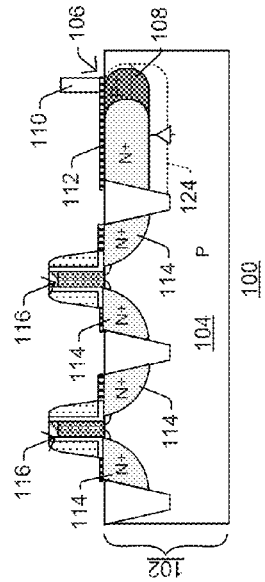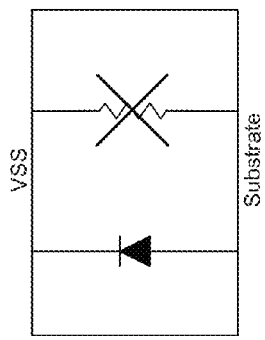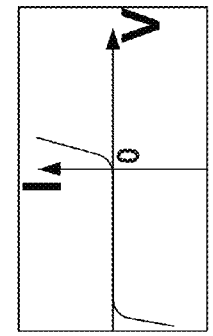
FIG. 2A  FIG. 2B  FIG. 2C
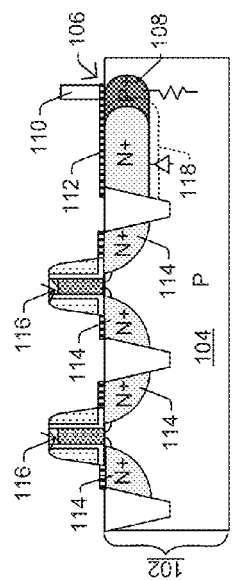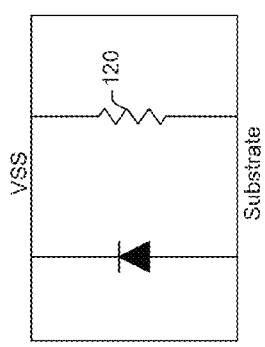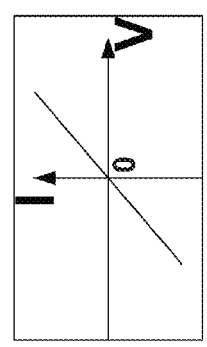
FIG. 1A  FIG. 1B  FIG. 1C

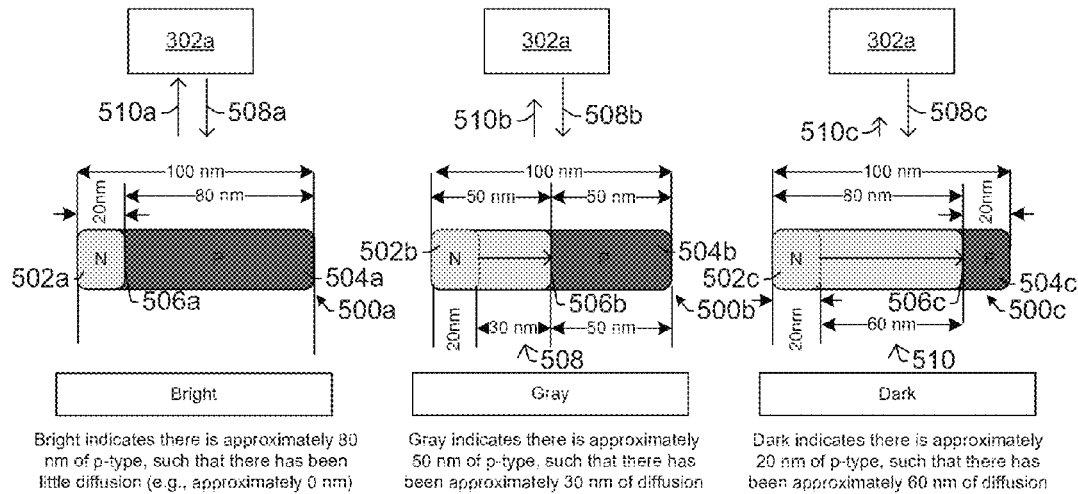
FIG. 5A  FIG. 5B  FIG. 5C
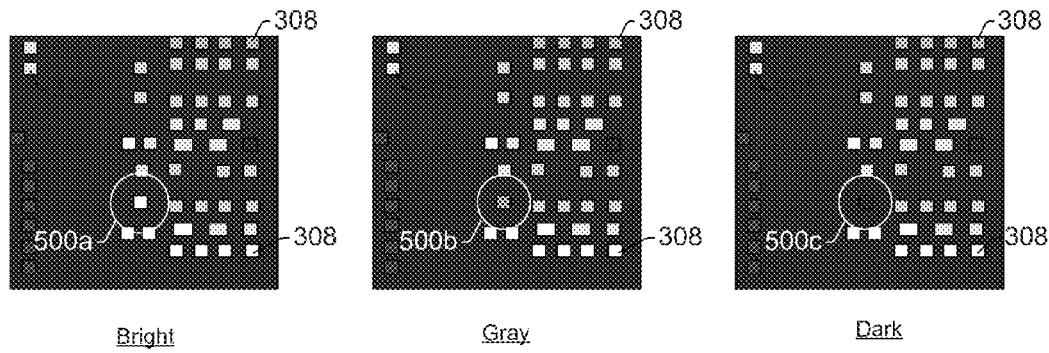
FIG. 6A  FIG. 6B  FIG. 6C

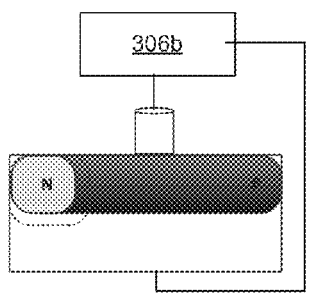
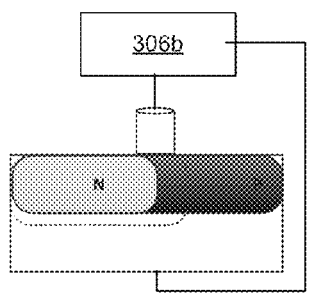
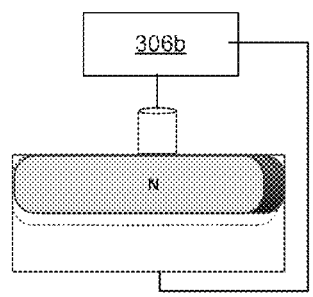
FIG. 7A             FIG. 7B             FIG. 7C
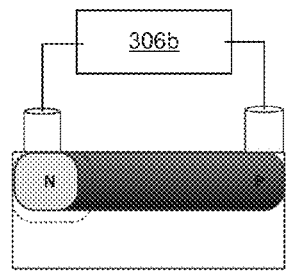
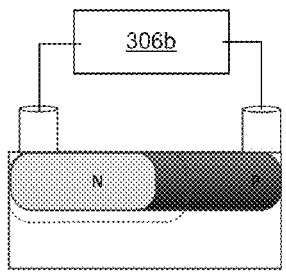
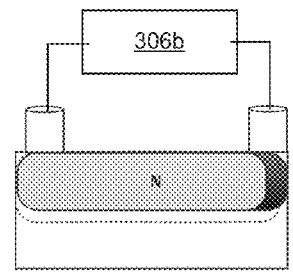
FIG. 8A             FIG. 8B             FIG. 8C

SMART MEASUREMENT TECHNIQUES TO ENHANCE INLINE PROCESS CONTROL STABILITY

BACKGROUND

To help streamline the manufacturing process of such devices on a single integrated circuit, the inventors have developed improved manufacturing processes.

BRIEF DESCRIPTION OF THE DRAWINGS

FIGS. 1A-1C illustrate an integrated circuit that has a desirable ohmic body contact.

FIGS. 2A-2C illustrate an integrated circuit where excess lateral diffusion has eliminated the ohmic body contact such that non-ohmic coupling occurs for the body contact.

FIGS. 5A-5C illustrate some embodiments of how a measurement system can measure lateral diffusion using optical techniques.

FIGS. 6A-6C illustrate some embodiments of how a measurement system can measure lateral diffusion using optical techniques.

FIGS. 7A-7C illustrate some embodiments of how a measurement system can measure lateral diffusion using electrical resistivity techniques.

FIGS. 8A-8C illustrate some embodiments of how a measurement system can measure lateral diffusion using electrical resistivity techniques.

DETAILED DESCRIPTION

Figure 3:
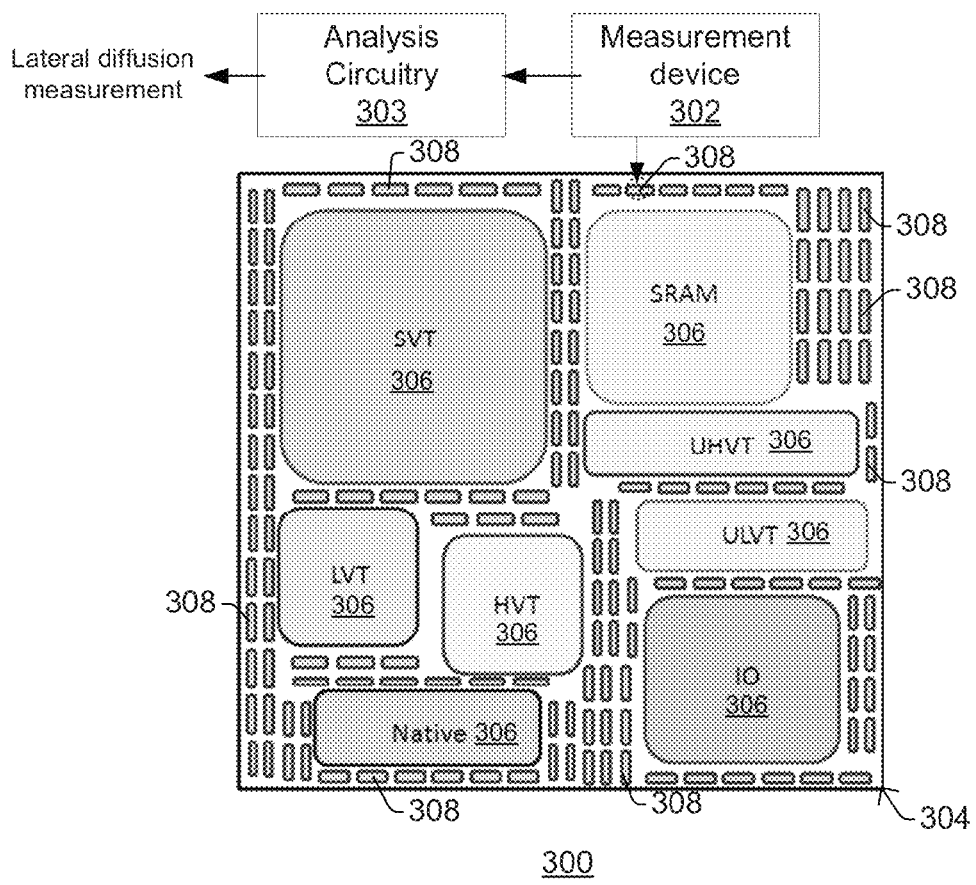
FIG. 3 illustrates some embodiments of a measurement system to measure lateral diffusion.

One or more implementations of the present invention will now be described with reference to the attached drawings, wherein like reference numerals are used to refer to like elements throughout. The drawings are not drawn to scale.

FIG. 1A shows a cross-sectional view of part of an integrated circuit (IC) 100. The IC 100 is formed on a semiconductor substrate 102 which includes an active region 104 having a first conductivity type. In the illustrated example, the active region 104, which acts as a body region for transistor devices formed on IC 100, is shown as being p-type, although the conductivities of the illustrated regions could be flipped such that the active region 104 could also be n-type in other embodiments. To properly bias the body region, a substrate contact 106 is present on the IC. The substrate contact 106 includes a highly doped p+ region 108 in substrate 102 and a vertical metal or polysilicon contact structure 110 coupled to the p+ region 108 through a silicide 112. Regions having a second conductivity type 114 (e.g., N+ source drain regions about opposite ends of gate structure 116) can diffuse laterally outwards toward highly doped p+ region 108 (as shown by dashed line 118). In normal/desired processes, this lateral diffusion 118 stops early enough to leave the highly doped p+ region 108 in direct contact with the underlying p-substrate 104. Thus, as shown in FIG. 1B, the p+ region 108 and contact 110 represent a resistance 120 between VSS and the underlying p-type body region 104, such that the electrical coupling between VSS and the body region 104 is said to be an ohmic coupling 122 as shown in FIG. 1C.

Unfortunately, as the inventors have appreciated and as shown in FIG. 2A, in real world scenarios the lateral diffusion of the n+ dopants from 114 may extend outward further than expected. This can be caused, for example, if thermal conditions are higher than is expected during processing of the IC 100, such as if annealing temperatures are slightly higher than expected because of small changes in manufacturing conditions. In the case of FIG. 2A, for example, the N+ dopants have now moved vertically under the highly doped p+ region 108 and laterally past the p+ region (see dashed line 124), so as to isolate the p+ region 108 from the underlying body region 104. As shown in FIGS. 2B-2C, the effect of this undesired excess diffusion is that the resistor 120 previously formed between the body region 104 and the contact structure 110 is "pinched off". Thus, the new contact structure is no longer ohmic in nature, but rather exhibits diode functionality in some respects, as shown in FIG. 2B-2C. This can impair the operation of the IC, possibly rendering it useless, particularly if multiple substrate contacts on the IC have this issue. Further, in conventional situations, this faulty substrate contact will not be identified, if at all, until after the full IC has been manufactured, which often requires several months of fabrication.

In view of these concerns, the present disclosure provides techniques for measuring a length at which dopants have laterally diffused across a substrate. In some embodiments, these techniques can be used early in the manufacturing process of semiconductor devices to detect whether the measured extend of diffusion equals an expected or target extent of diffusion. If the measured diffusion length is greater than the expected or target diffusion length, the process can be adjusted to decrease diffusion for subsequent wafers; whereas if the measured diffusion is less than the expected or target diffusion, then the process can be adjusted to increase diffusion for subsequent wafers. By applying lateral diffusion measurement techniques early in the manufacturing process, faults can be detected in their infancy such that engineers can adjust process settings for future lots of wafers to improve the overall field of the fab.

FIG. 3 illustrates one example of a system 300 capable of measuring lateral diffusion by using lateral diffusion measurement structures which are arranged on a wafer. The system includes a measurement device 302, analysis circuitry 303, and a wafer having a number of die 304 thereon. Each die 304 can include active circuitry regions 306 and lateral diffusion measurement structures 308 which are arranged in a substrate region between active circuitry regions 306. The substrate region can exhibit an absence of active devices which are coupled to the active circuitry regions 306, and in some instances can be entirely devoid of active devices. Although FIG. 3 illustrates the measurement device 306 performing a measurement on an integrated circuit or die 304 (which may appear to be standalone in FIG. 3), the measurement device 302 often takes measurements during the manufacturing process on a wafer made up of multiple dies, rather than on an individual die or IC, as this allows earlier detection of faults.

Figure 4:
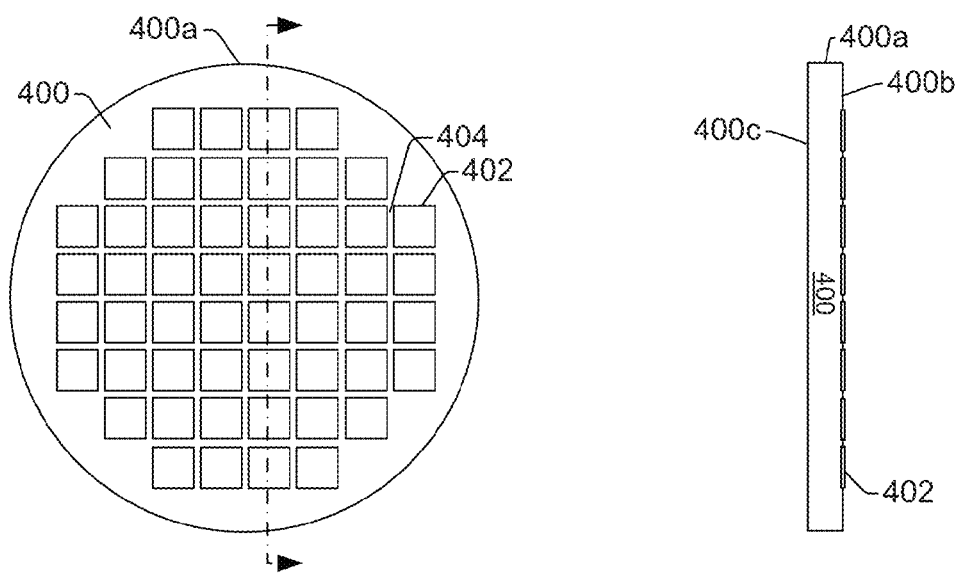
FIG. 4 illustrates some embodiments of semiconductor wafer.

For reference, FIG. 4, which is now briefly discussed, shows a semiconductor wafer 400 that includes a number of die 402, each of which can correspond to die 304 as illustrated in FIG. 3, for example. FIG. 4's wafer 400 has a circumferential edge 400a that bounds first and second wafer faces 400b, 400c. On the first face 400b, semiconductor devices such as transistors, diodes, and the like, are arranged as a series of die (e.g., 402). The semiconductor devices are built up by forming alternating conducting and insulating layers, and performing photolithography to pattern these layers. Ions are also implanted into the wafer at various times to form device features. After the fabrication process is complete, the wafer 400 is cut along scribe lines 404 between neighboring dies, such that each die corresponds to a separate integrated circuit. Although FIG. 3 illustrates lateral diffusion measurement structures 308 being arranged between active circuitry regions 306, the lateral diffusion measurement structures 308 can also be arranged in the scribe lines 404.

Referring back to FIG. 3, during operation, the measurement device 302 measures an electrical or optical condition of a lateral diffusion measurement structure 308. As will be appreciated in more detail below, after the measurement device 302 has measured the electrical or optical condition of one or more lateral diffusion measurement structure(s) 308, the analysis circuitry 303 can determine the extent of lateral diffusion of dopants on the wafer based on the measured condition(s). Diffusion measurements from some wafers, which are further along in the fabrication process, can be used to tune the fabrication process for other wafers, which are earlier in the fabrication process. Thus, if the diffusion measurements indicate process parameters are out of specification for the wafers further along in the fabrication process, then the process can be adjusted for the wafers earlier in the fabrication process so these wafers can be manufactured to be better within specification.

To illustrate some embodiments of how these techniques can be implemented, FIGS. 5-6 collectively illustrate a method that measures an optical condition of a lateral diffusion measurement structure to determine the extent of lateral diffusion. In particular, FIGS. 5A-5C show top views of three lateral diffusion measurement structures 500, each having a lateral length of approximately 100 nm and made up of an n-type region 502 and a p-type region 504 that meet at a p-n junction 506. Other embodiments of lateral diffusion measurement structures could have other lateral lengths.

In FIG. 5A, the n-type region 502a has been implanted so as to have a length of 20 nm, while the p-type region 504a spans the remaining 80 nm. FIG. 5A can thus correspond to a time during manufacture when the n-type region 502a was just formed (e.g., implanted) with no significant lateral diffusion occurring. To measure the extent of lateral dopant diffusion, an optical measurement device 302a transmits light 508a towards the lateral diffusion measurement structure 500a, and subsequently receives light 510a reflected back from structure 500. Because p-type material is more reflective than n-type material at the spectrum of transmitted light, the device 306a can compare the amount of transmitted light 508a to the amount of received light 510a, and then determine the relative areas of n-type and p-type material in diffusion measurement structure 500a based on this comparison. In FIG. 6A, for example, which illustrates a number of lateral diffusion measurement structures, a lateral diffusion measurement structure (see circle 500a) corresponding to that of FIG. 5A is illustrated as being "bright" (highly reflective). Thus, the "bright" lateral diffusion measurement structure in FIG. 6A indicates that the lateral diffusion measurement structure 500a has a large percentage of reflective p-type material and a low percentage of less-reflective n-type material (e.g., there has been little lateral diffusion, if any).

In FIG. 5B, the n-type region 502b was again initially implanted so as to have a length of 20 nm with the p-type region 504b spans the remaining 80 nm. However, in FIG. 5B, thermal processing has been subsequently carried out on the wafer, causing lateral diffusion of dopants to occur. In the illustrated example of FIG. 5B, 30 nm of lateral diffusion has occurred (508). The optical measurement device 306a transmits light 508b towards the lateral diffusion measurement structure 500b and determines how much of the originally transmitted light is reflected back 510b, for example as a ratio or percentage between 508b/510b. Thus, in FIG. 6B, a lateral diffusion measurement structure (see circle 500b) corresponding to that of FIG. 5B is illustrated as being "gray" (somewhat reflective). Thus, the "gray" lateral diffusion measurement structure in FIG. 6B indicates that the lateral diffusion measurement structure 500b has roughly equal areas of p-type material and n-type material. For example, if the reflective area of 50% indicates that the p-n junction is at 50 nm, and it was known that the original n-type width was 20 nm, taking the difference between these two numbers indicates that 30 nm of diffusion has occurred.

In FIG. 5C, the n-type region 502c was again initially implanted so as to have a length of 20 nm with the p-type region 504c spans the remaining 80 nm. However, thermal processing has been subsequently carried out on the wafer, causing the n-type dopants to laterally diffuse 80 nm from the original implantation location (510). Hence, in FIG. 6C, the optical measurement device 306a now sees the diffusion measurement structure corresponding to that of FIG. 5C (see circle 500c) as being "dark" (relatively un-reflective compared to FIG. 6A-6B). Thus, the "dark" lateral diffusion measurement structure in FIG. 6C indicates that there has been significant lateral diffusion (e.g., approximately 60 nm or more).

Although only three gradations of light intensity (e.g., bright, gray, and dark) are illustrated in FIGS. 5-6 for purposes of understanding, it will be appreciated that any number of such gradations may be present, with greater numbers of gradations providing greater precision as to the relative areas between n-type and p-type areas, and thus, more accurate measurements of diffusion distances. By evaluating the intensity of light reflected from the lateral diffusion structure relative to that of the transmitted light, the system can determine the extent of lateral diffusion of dopants on the wafer. For example, in some implementations, the graduated lateral diffusion measurement structures can each have an overall length of approximately 100 nm and can each have one of ten different graduations. Thus, target junction locations in such an example can be located at 10 nm, 20 nm, 30 nm, 40 nm, . . . 80 nm, and 90 nm from an edge of the various lateral diffusion measurement structures, with each lateral diffusion measurement structure having one of these target junction locations.

Rather than determining an extent of lateral diffusion solely from optical measurement techniques as illustrated with regards to FIGS. 5-6, some aspects of this disclosure can also determine an extent of lateral diffusion from electrical conductivity/resistance. FIGS. 7-8, which are now described below, show two such examples.

In FIG. 7A-7C, an electronic measurement device 306b is used to measure the lateral diffusion of dopants on a lateral diffusion measurement structure 700. In this technique, a single contact is formed at a predetermined location (e.g., the midpoint) of a lateral diffusion measurement structure. When used in conjunction with a contact placed on backside of wafer, this contact can be used to measure resistance curves of the structure to determine how much lateral diffusion has occurred. For example, in FIG. 7A, if the electronic measurement device applies time-varying currents and voltages between backside of wafer and contact, which is well within the type p-region, the resultant IV curve looks ohmic (see e.g., FIG. 1C). In contrast, if the same time-varying currents and voltages are applied to the lateral diffusion structure of FIG. 7C, the IV curve looks non-ohmic (see e.g., FIG. 2C). The IV curve for FIG. 7B's lateral diffusion structure will be a blend between those of FIGS. 7A and 7C (e.g., less than purely ohmic, but still showing some signs of being ohmic). In other embodiments, the single contact can be formed at another pre-determined location on the lateral diffusion structure. In some embodiments, the locations of contacts can be graduated over a plurality of lateral diffusion measurement structures to give a better idea of the extent of diffusion (see e.g., FIG. 9A-9C discussed further below).

In FIGS. 8A-8C, two contacts are formed to measure electrical conductivity between different regions of the lateral diffusion measurement structure (e.g., at opposing ends of the lateral diffusion measurement structure). In this example, the resistance between the contacts can change slightly depending on the exact location of the p-n junction and the ratio between n-type material and p-type material. For example, in FIGS. 8A-8B, a p-n junction is arranged between the contacts, such that diode-like (e.g., non-ohmic) IV characteristics will be present between the first and second contacts. In FIG. 8C, however, the p-n junction may be aligned under the contact, such that the resistance between the contacts may appear to be more ohmic (e.g., more akin to just a n-type doped region, rather than a p-n junction).

Figure 9A:
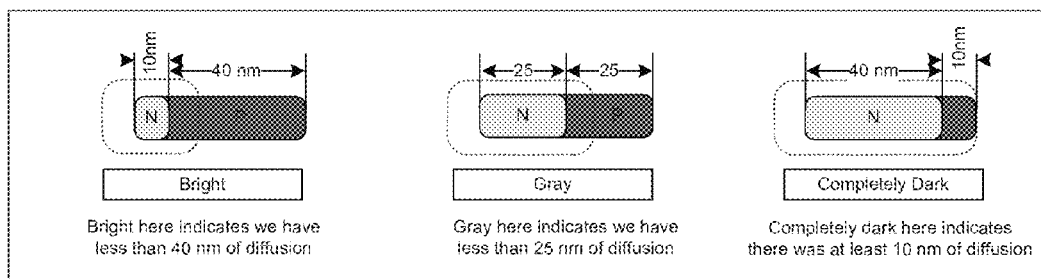
FIGS. 9A-9C illustrate some embodiments of how a measurement system can measure lateral diffusion using optical techniques.
Figure 9B:
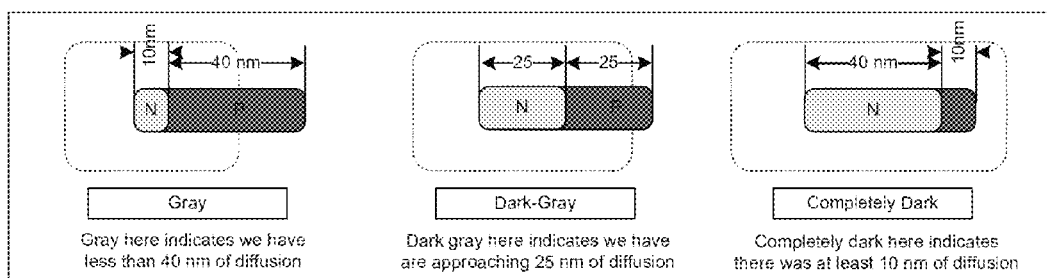
Figure 9C:
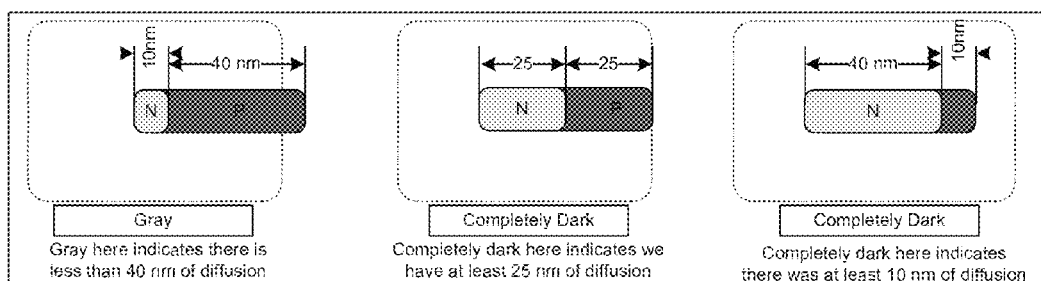

FIGS. 9A-9C show an example where a wafer includes a series of graduated lateral diffusion measurement structures rather than only a single lateral diffusion measurement structure, as described in previous figures. These graduated lateral diffusion measurement structures can be evaluated using optical techniques or electrical techniques, although optical techniques are described now for purposes of clarity.

FIG. 9A, for example, illustrates a wafer which includes three graduated lateral diffusion measurement structures spread over a face of the wafer. Each of these three graduated lateral diffusion measurement structures has a lateral length of approximately 50 nm, which is split between an n-type region and a p-type region which meet at a p-n junction. In the first lateral diffusion measurement structure, the n-type region is initially implanted to have a length of approximately 10 nm, with the p-type region having a length of approximately 40 nm. In the second lateral diffusion measurement structure, the n-type and p-type regions are initially implanted to have approximately equal lengths of approximately 25 nm. In the third lateral diffusion measurement structure, the n-type region is initially implanted to have a length of approximately 40 nm, with the p-type region having a length of approximately 10 nm.

During processing, some unknown amount of diffusion occurs. Ideally, this unknown amount of diffusion would be equal to a target amount, although the extent of diffusion can vary depending on the manufacturing conditions. In FIG. 9A, for example, each graduated lateral diffusion measurement structure undergoes 10 nm of N+ diffusion (as indicated by the dashed rectangle for each structure). To accurately measure the extent of this diffusion, a measurement device analyzes optical or electrical condition of each graduated lateral diffusion measurement structure. For example, on the first lateral diffusion measurement structure in FIG. 9A, an optical measurement device sees the structure as "bright", indicating there is a small amount of N+ diffusion. On the second lateral diffusion measurement structure in FIG. 9A, the optical measurement device sees the structure as "gray", due to the n-type and p-type regions having approximately equal areas after the diffusion. Lastly, the third lateral diffusion measurement structure in FIG. 9A will exhibit a completely dark optical measurement, as the 10 nm of lateral N+ diffusion now extends beyond the outermost edge of the p-type region. Hence, the structures have a pattern of "bright", "gray", and "completely dark".

In FIG. 9B, the same graduated lateral diffusion measurement structures as formed in FIG. 9A now undergo 20 nm of N+ diffusion (as indicated by the dashed rectangle for each structure). This results in the structures having a pattern of "gray" (left-most), "dark gray" (middle), and "completely dark" (right-most).

Finally, in FIG. 9C the same graduated lateral diffusion measurement structures as formed in FIGS. 9A-9B now undergo 30 nm of N+ diffusion (as indicated by the dashed rectangle for each structure). This results in the structures having a pattern of "gray" (left-most), "completely dark" (middle), and "completely dark" (right-most).

By analyzing the pattern of reflectivity (or electrical conductivity) for the successive graduated lateral diffusion measurement structures, the techniques allow for accurate measurement of lateral diffusion. These techniques are somewhat like a Vernier caliper in that the graduated lateral diffusion measurement structures are generated to have different diffusion lengths (e.g., a first scale), and the measurement provides a smaller resolution (e.g., a second scale) that is superimposed over the first scale. Thus, highly accurate lateral diffusion measurements can be achieved, particularly early in the manufacturing process.

Figure 10:
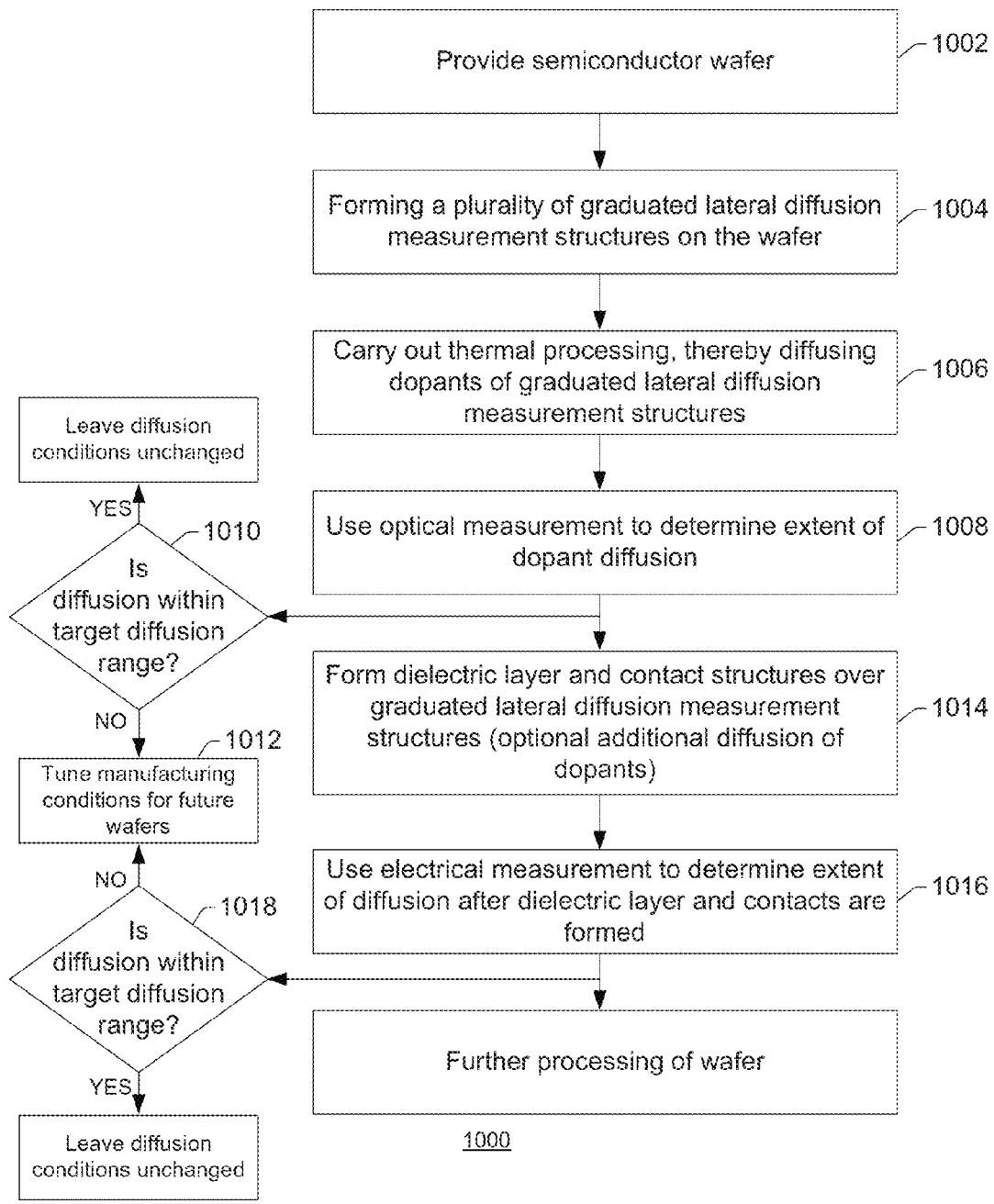
FIG. 10 illustrates some embodiments of methods for measuring lateral diffusion of dopants on a semiconductor wafer.

FIG. 10 illustrates some embodiments of a method 1000 for measuring lateral diffusion. It will be appreciated that although FIG. 10 illustrates a number of acts, not all of these acts are necessarily required to implement the invention, and other un-illustrated acts may also be present. The method 1000 starts at 1002, where a semiconductor wafer is provided.

At 1004, a number of graduated lateral diffusion measurement structures on the wafer. Each lateral diffusion measurement structure can include a first region having a first conductivity type, and a second region having a second conductivity type. For example, the first region can be a highly doped p-type region (e.g., p+ contact region formed in a p-type active region), and the second region can be a highly doped n-type region corresponding to source/drain regions which are near the first region. The first and second regions can be formed by implanting ions through first and second masks over the wafer or other techniques.

In 1006, thermal processing is carried out, thereby diffusing the dopants of the lateral diffusion measurement structures. This diffusion can be in the form of an activation anneal, or can be other thermal processes of various temperatures and durations.

In 1008, while the first and second regions are still exposed on the face of the wafer, an optical measurement can be carried out to determine the extent of diffusion. The use of an optical measurement here is convenient in that it does not require test probes or other structures coming into contact with the wafer. Thus, this can reduce contamination or defects on the wafer, relative to other embodiments where electrical measurements are carried out.

In 1010, the method 1000 determines whether the measured diffusion is within a target diffusion range at this point in the process. If the measured diffusion is not within the target diffusion range for this wafer ("NO" at 1012), the manufacturing process can be tuned to attempt to bring the diffusion to within the target diffusion range for future wafers in 1012. Advantageously, this measurement occurs very early during manufacturing so that faults can be detected early and prevented or limited for future wafers.

In 1014, after the dopants have been diffused, a dielectric layer (e.g., a gate dielectric layer or an inter-level dielectric layer) is formed along with contact structures to the first and/or second regions. Additional diffusion may also occur in formation of these or other layers. Ideally, these contacts will be ohmic.

In 1016, the method uses electrical measurement to determine the extent of diffusion for the first and second regions after the dielectric layer and contacts are formed. In 1018, the method evaluates whether this newly measured diffusion in within a target diffusion range for this stage of manufacturing. If the measured diffusion is not within the target diffusion range for this wafer ("NO" at 1018), the manufacturing process can be tuned to attempt to bring the diffusion to within the target diffusion range for future wafers in 1014. Advantageously, the electrical and optical measurements can be used at different stages during manufacture in this embodiment to monitor diffusion as the manufacturing process progresses, such that fab yields can be kept high.

FIGS. 11-19 collectively depict a method of manufacturing a lateral diffusion measurement structure in accordance with some embodiments. While this method is illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases, and are not limited to the structures illustrated in the figures.

Figure 11:
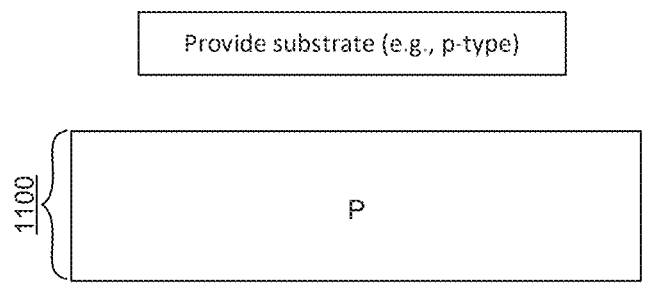
FIGS. 11-19 collectively illustrate a method of manufacturing lateral diffusion measurement structures.

In FIG. 11, a substrate 1100 is provided. In the illustrated example, the substrate is a p-type substrate, however, in other examples where the conductivity types are flipped the substrate could alternatively be an n-type substrate. It will be appreciated that "substrate", "semiconductor workpiece" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed there over, among others. Further, the semiconductor workpiece can also include non-semiconductor materials such as oxide in silicon-on-insulator (SOI), partial SOI substrate, polysilicon, insulator, oxide, metal, amorphous silicon, or organic material, among others. In some embodiments, the semiconductor workpiece can also include multiple wafers or dies which are stacked or otherwise adhered together. The semiconductor workpiece can include wafers which are cut from a silicon ingot, and/or any other type of semiconductor/non-semiconductor and/or deposited or grown (e.g. epitaxial) layers formed on an underlying substrate.

Figure 12:
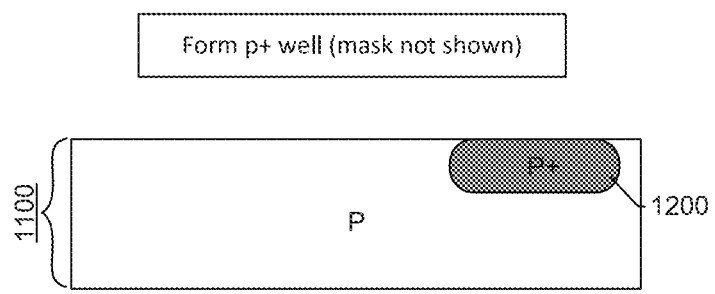

In FIG. 12, a mask layer (not shown) is formed and patterned over the substrate 1100, and a well region 1200 is formed by using the mask. The well region 1200 has the same conductivity type as the substrate 1100, albeit at a higher dopant concentration (e.g., p+). The mask can cover some areas of the substrate while leaving other regions exposed. Hence, while the mask is in place, ions can be implanted into the exposed regions while the mask blocks ions from entering the covered substrate areas.

Figure 13:
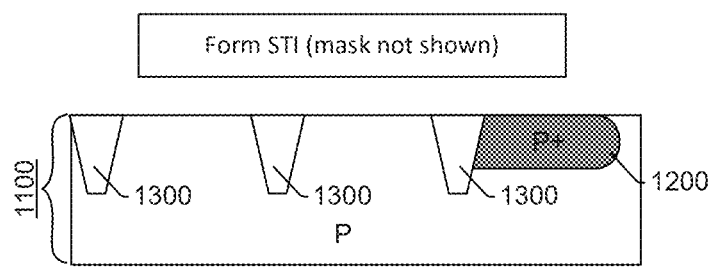

In FIG. 13, shallow trench isolation (STI) regions 1300 are formed. To form the STI regions, an STI mask layer is formed and patterned over the substrate 1100, and an etch is carried out with the STI mask in place to form trenches in the substrate 1100. The trenches are then filled in with dielectric material, and chemical mechanical polishing (CMP) is carried out to form the STI regions 1300 depicted in FIG. 13.

Figure 14:
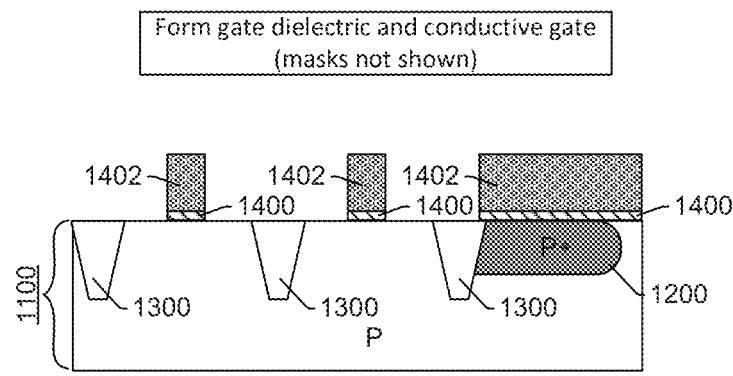

In FIG. 14, a gate dielectric layer 1400 and conductive gate electrode layer 1402 are formed over the substrate 1110. As with previous layers, after the gate dielectric layer 1400 and conductive gate electrode layer 1402 are formed, a mask (not shown) is patterned there over. With this mask in place, an etch is carried out to form the gate structures 1400, 1402 illustrated in FIG. 14.

Figure 15:
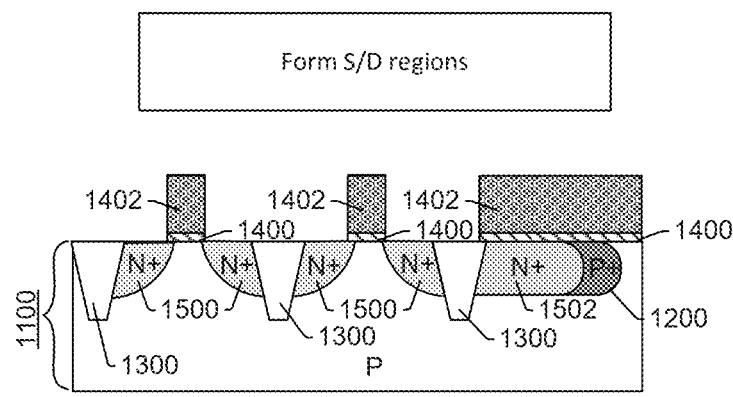

In FIG. 15, a source/drain implant, which is self-aligned to the gate stacks, can be carried out to form source/drain regions 1500 having an N+ conductivity. When subsequent thermal processing steps are carried out, such as an anneal, the source drain regions can laterally diffuse to form out-diffused region 1502. If too much lateral diffusion occurs, the P+ well region 1200 can be counter-doped, such that it is completely undercut or "pinched off", which can lead to diode behavior for a contact subsequently formed over the p+ well region 1200. Hence, the length of this lateral diffusion 1502 is measured during processing so the manufacturing process can be accurately characterized, and can be adjusted as needed.

Figure 16:
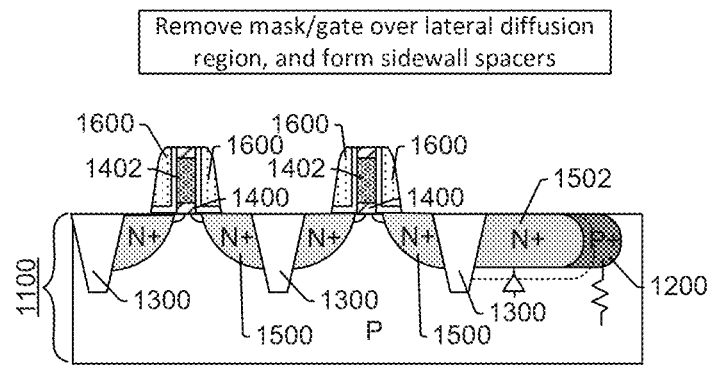

In FIG. 16, the gate structure is removed over the lateral diffusion region 1502 and well region 1200, and sidewall spacers 1600 are formed over the remaining gate electrode structures.

Figure 17:
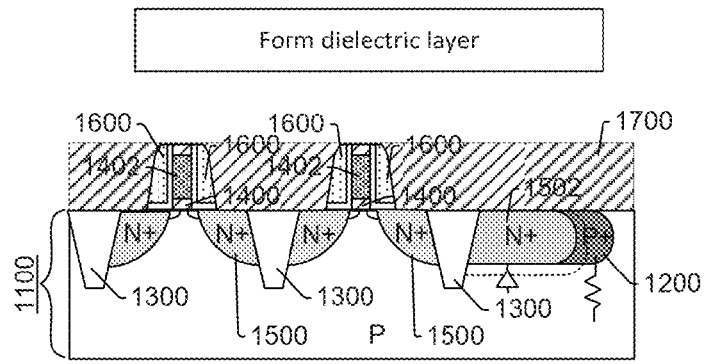

In FIG. 17, a dielectric layer 1700, such as a low-k dielectric, is formed over the gate electrode and between neighboring gate electrodes.

Figure 18:
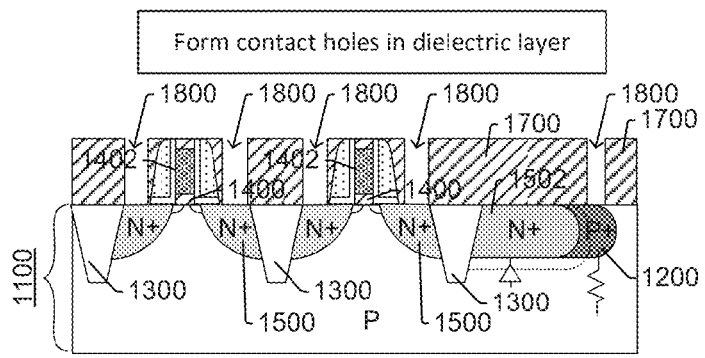

In FIG. 18, contact holes 1800 are formed in the dielectric layer 1700. These contact holes extend downwardly to contact the source/drain regions 1500 as well as the well region 1200.

Figure 19:
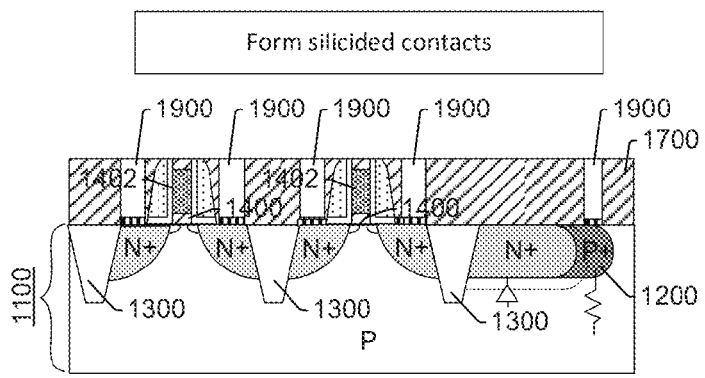

In FIG. 19, silicided contacts 1900 are formed. So long as the lateral diffusion from N+ source drain regions 1502 does not counter-dope well region 1200 over its complete lateral length, there will still be some part of well region 1200 which the contact 1902 can couple. Thus, by measuring the lateral diffusion length and adjusting the process as necessary to keep the diffusion length within desired limits, aspects of the present disclosure can help to ensure that ohmic contacts remain in place between silicided contact 1900 and well region 1200 (e.g., contact to substrate or active area region).

Thus, it will be appreciated that some embodiments relate an integrated circuit that includes a number of lateral diffusion measurement structures arranged on a silicon substrate. A lateral diffusion measurement structure includes a p-type region and an n-type region which cooperatively span a predetermined initial distance between opposing outer edges of the lateral diffusion measurement structure. The p-type and n-type regions meet at a p-n junction expected to be positioned at a target junction location after dopant diffusion has occurred.

Some embodiments relate to an integrated circuit (IC). The IC includes a plurality of active circuit regions comprising active devices. A substrate region is arranged between neighboring active circuit regions. A plurality of graduated lateral diffusion measurement structures are arranged in the substrate region. A lateral diffusion measurement structure includes a p-type region and an n-type region which cooperatively span a predetermined initial distance between opposing outer edges of the lateral diffusion measurement structure. The p-type and n-type regions meet at a p-n junction expected to be positioned at a target junction location after dopant diffusion has occurred. The target junction location is different for different graduated lateral diffusion measurement structures within the plurality of graduated lateral diffusion measurement structures.

Still other embodiments relate to a method. In this method, a plurality of graduated lateral diffusion measurement structures are formed to measure lateral diffusion of dopants on a semiconductor substrate. The individual graduated measurement structures have different graduations from one another. After the graduated lateral diffusion measurement structures have been formed, the method analyzes lateral diffusion of dopants from an initially implanted location to a diffused location in each of the graduated measurement structures to determine an extent of lateral diffusion.

In addition, it will be appreciated that identifiers such as "first" and "second" do not imply any type of ordering, placement, or temporal relationship with respect to other elements; but rather "first" and "second" and other similar identifiers are just generic identifiers and these elements can be swapped in other implementations.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit, comprising:
a plurality of lateral diffusion measurement structures arranged on a silicon substrate and spaced apart from one another, wherein the lateral diffusion measurement structures each include a p-type region and an n-type region which meet at respective target junction locations and which cooperatively span a first distance, X, which is the same as measured between opposing outer edges of the respective lateral diffusion measurement structures; and
wherein the target junction locations for the respective lateral diffusion measurement structures are spaced at different integer multiples of a second distance, Y, as measured from edges of the respective lateral diffusion measurement structures.

2. The integrated circuit of claim 1, wherein each lateral diffusion measurement structure has one of X/Y minus one different target junction locations, wherein the X/Y minus one different target junction locations are spaced equidistantly along the first distance, X, for the respective lateral diffusion measurement structures.

3. The integrated circuit of claim 1, wherein the first distance, X, is between 60 nm and 200 nm.

4. The integrated circuit of claim 1, wherein the first distance, X, is approximately 100 nm and the second distance, Y, is approximately 10 nm, such that each lateral diffusion measurement structure has one of nine different target junction locations, wherein the nine different target junction locations are spaced equidistantly between the opposing edges of the respective lateral diffusion measurement structures.

5. The integrated circuit of claim 1, further comprising:
a first contact coupled to the p-type region of a lateral diffusion measurement structure, and
a second contact which is coupled to the n-type region of the lateral diffusion measurement structure or which is coupled to a backside of the silicon substrate.

6. An integrated circuit, comprising:
a plurality of active circuit regions comprising active devices;
a substrate region arranged between neighboring active circuit regions; and
a plurality of graduated lateral diffusion measurement structures arranged in the substrate region, wherein each lateral diffusion measurement structure includes a p-type region and an n-type region which cooperatively span a first distance between opposing outer edges of the respective lateral diffusion measurement structures, and wherein the plurality of graduated lateral diffusion measurement structures each have the same first distance between their opposing outer edges;
wherein the p-type and n-type regions meet at a p-n junction expected to be positioned at a target junction location after dopant diffusion has occurred;
wherein the target junction location is different for different graduated lateral diffusion measurement structures within the plurality of graduated lateral diffusion measurement structures.

7. The integrated circuit of claim 6, wherein the plurality of graduated lateral diffusion measurement structures have a plurality of target junction locations, respectively, each of which is spaced at an integer multiple of a second distance from an edge of a respective graduated lateral diffusion measurement structure.

8. The integrated circuit of claim 6, further comprising:
a first contact coupled to the p-type region of a lateral diffusion measurement structure, and
a second contact which is coupled to the n-type region of the lateral diffusion measurement structure or which is coupled to a backside of a semiconductor substrate in which the active circuit regions are disposed.

9. The integrated circuit of claim 6, wherein the target junction locations are spaced at an integer multiple of a second distance from edges of the respective lateral diffusion measurement structures.

10. The integrated circuit of claim 6, wherein the plurality of lateral diffusion measurement structures each exhibit the same first distance between their respective opposing outer edges.

11. The integrated circuit of claim 10, wherein the first distance is between 60 nm and 200 nm.

12. The integrated circuit of claim 9, wherein the first distance is approximately 100 nm and the second distance is approximately 10 nm, such that each lateral diffusion measurement structure has one of ten different target junction locations, wherein the ten different target junction locations are spaced equidistantly between the opposing edges of the respective lateral diffusion measurement structures.

13. The integrated circuit of claim 9, wherein the second distance is equal to the first distance divided by a positive integer number.

14. A system, comprising:
a semiconductor wafer including a plurality of lateral diffusion measurement structures thereon, wherein respective lateral diffusion measurement structures have equal lengths as measured from their respective outer edges, wherein the respective lateral diffusion measurement structures include a p-type region and an n-type region, respectively, which meet at respective pn junctions arranged at respective predetermined target junction locations within the respective lateral diffusion measurement structures, and wherein respective target junction locations are arranged at different predetermined distances from outer edges of the respective lateral diffusion measurement structures; and
a measurement element to analyze optical or electrical properties of the plurality of lateral diffusion measurement structures to determine a diffusion distance which dopants have diffused from an initial location laterally along the lateral diffusion measurement structures.

15. The system of claim 14, wherein the plurality of lateral diffusion measurement structures are arranged in scribe lines of the wafer.

16. The system of claim 14, wherein the measurement element is configured to determine the diffusion distance by:
providing amounts of light onto the respective lateral diffusion measurement structures;
determining corresponding amounts of the light which are reflected from the respective lateral diffusion measurement structures and received at an optical sensor; and
determining actual locations of the respective p-n junctions based on a ratio between the amounts of light provided onto the respective lateral diffusion measurement structures and the corresponding amounts of light received at the optical sensor.

17. The system of claim 14, wherein the measurement element is configured to determine the diffusion distance by:
performing an electrical resistivity measurement to determine respective resistances between respective first contacts, which are coupled to the respective lateral diffusion measurement structures, and respective second contacts, which are coupled to the respective lateral diffusion measurement structures; and
determining actual locations of the respective p-n junctions based on the respective resistances.

18. The system of claim 14, further comprising:
analysis circuitry configured to determine the diffusion distance by determining a difference between an actual location of a p-n junction after dopant diffusion has occurred and a corresponding target junction location;
wherein the difference is measured for a first wafer, which is at a first stage in a fabrication process, and
wherein the difference is used to tune the fabrication process to be used on second wafer, which is at a second stage in the fabrication process that is prior to the first stage.

19. The system of claim 14, wherein the p-type region and n-type region cooperatively span a first distance, X, which is the same as measured between opposing outer edges of the respective lateral diffusion measurement structures, and the target junction locations for the respective lateral diffusion measurement structures are spaced at different integer multiples of a second distance, Y, as measured from edges of the respective lateral diffusion measurement structures.

20. The system of claim 19, wherein each lateral diffusion measurement structure has one of X/Y minus one different target junction locations, where the X/Y minus one different target junction locations are spaced equidistantly along the first distance, X, for the respective lateral diffusion measurement structures.

* * * * *